United States Patent
Mantegazza et al.

(10) Patent No.: US 9,653,127 B1
(45) Date of Patent: May 16, 2017

(54) METHODS AND APPARATUSES FOR MODULATING THRESHOLD VOLTAGES OF MEMORY CELLS

(71) Applicant: Micron Technology, Inc., Boise, ID (US)

(72) Inventors: Davide Mantegazza, Palo Alto, CA (US); Kiran Pangal, Fremont, CA (US); Feng Q. Pan, Boise, ID (US); Hernan A. Castro, Shingle Springs, CA (US); DerChang Kau, Cupertino, CA (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 14/970,380

(22) Filed: Dec. 15, 2015

(51) Int. Cl.
G11C 5/14 (2006.01)

(52) U.S. Cl.
CPC .................... G11C 5/147 (2013.01)

(58) Field of Classification Search
CPC .................................................. G11C 13/004
USPC .......................................................... 365/148
See application file for complete search history.

(56) References Cited

U.S. PATENT DOCUMENTS

| | | | |
|---|---|---|---|
| 2009/0237984 A1* | 9/2009 | Porter | G11C 13/0004 365/163 |
| 2011/0278528 A1* | 11/2011 | Lung | H01L 27/2454 257/2 |
| 2013/0016557 A1* | 1/2013 | Kim | G11C 13/0004 365/163 |
| 2014/0104925 A1* | 4/2014 | Azuma | G11C 13/004 365/148 |
| 2015/0243355 A1* | 8/2015 | Lee | G11C 13/0069 365/148 |
| 2015/0279458 A1* | 10/2015 | Papandreou | G11C 13/004 365/163 |
| 2016/0055904 A1* | 2/2016 | Park | G11C 13/003 365/148 |
| 2016/0093375 A1* | 3/2016 | Srinivasan | G11C 7/12 365/163 |

* cited by examiner

*Primary Examiner* — Min Huang
(74) *Attorney, Agent, or Firm* — Dorsey & Whitney LLP

(57) ABSTRACT

Methods and apparatuses for increasing the voltage budget window of a memory array are disclosed. One or more pre-bias voltages may be applied across a selected cell by providing voltages to memory access lines coupled to the selected cell. The threshold voltage of the selected cell may decrease responsive to the pre-bias voltage. Conversely, threshold voltage of deselected cells coupled to only one of the memory access lines coupled to the selected cell may increase responsive to the pre-bias voltage. The decrease of the threshold voltage of the selected cell and the increase of the threshold voltage of the deselected cells may increase the voltage window of the memory array.

22 Claims, 7 Drawing Sheets

METHODS AND APPARATUSES FOR MODULATING THRESHOLD VOLTAGES OF MEMORY CELLS

BACKGROUND

Memory devices may include memory cells for storing data. A memory cell may include a storage element coupled to a selector device. The storage element and selector device may be located at an intersection of two memory access lines (e.g., a word line and a bit line) in a memory array having a cross-point architecture. The selector may be coupled to a word line and the storage element may be coupled to a bit line in some architectures. The selector device may reduce leakage currents and allow selection of a single storage element for reading and/or writing.

Cross-point memory architecture may have, as selector device, an amorphous chalcogenide element characterized by a threshold voltage (VT). The storage element may also be a chalcogenide device in either a crystalline or amorphous state. The crystalline and amorphous states may correspond to different logic states (e.g., '1' or '0'). In the amorphous state, the storage element may have the same threshold voltage (VT) as the selector device in some architectures. In other architectures, in the crystalline state, the storage element may have the same threshold voltage (VT) as the selector device. The overall cross-point memory cell is the series of the selector device and storage element. The memory cell may have either a low VT (VT_SET) when the storage element is in a crystalline state or a high VT (VT_RESET) when the storage element is in an amorphous state. The high and low threshold voltages which may be associated with the amorphous and crystalline states, respectively, may be representative of different logic states stored in the memory cell.

A memory array may have a memory voltage window budget that defines the maximum and minimum voltages for selecting memory cells within the memory array. Memory voltage window budget parameters may include the maximum VT_RESET voltage (VT_RESET_max) and the minimum VT_SET voltage (VT_SET_min) of the complete memory array of memory cells. At a first order, VT_RESET_max −VT_SET_min should be smaller than half of the maximum operating voltage available in order to properly access individual memory cells. VT_RESET_max and VT_SET_min may depend on one or more physical parameters of the selector device and/or the storage element (e.g., the chalcogenide chemical composition, thickness, cell-to-cell variability, etc.).

The cell-to-cell VT variability may increase the difference (delta) between VT_RESET_max and VT_SET_min such that the difference between VT_RESET_max and VT_SET_min is greater than the available voltage window. This may prevent the memory array from meeting the voltage window requirement. Currently, techniques to reduce cell-to-cell variability rely on the reduction of the variability of the physical parameters of the selector device and storage element that affect threshold voltage.

DETAILED DESCRIPTION

Certain details are set forth below to provide a sufficient understanding of embodiments of the invention. However, it will be clear to one skilled in the art that embodiments of the invention may be practiced without these particular details. Moreover, the particular embodiments of the present invention described herein are provided by way of example and should not be used to limit the scope of the invention to these particular embodiments. In other instances, well-known circuits, control signals, timing protocols, and software operations have not been shown in detail in order to avoid unnecessarily obscuring the invention.

As described herein, the threshold voltage (VT) of a memory cell may be modulated by applying a bias voltage below the VT across the memory cell. Depending, at least in part, on the magnitude of the applied bias voltage, the VT of the memory cell may either increase or decrease. In general, the VT of a memory cell may increase responsive to a bias voltage well below the VT (e.g., bias voltage=3.0V, VT=6.0V). Conversely, the VT of the memory cell may decrease responsive to a bias voltage below but near the VT (e.g., bias voltage=5.5V, VT=6.0V). Modulating the VT of the memory cell by applying the bias voltage may allow the voltage window of a memory array to be increased, as well as meeting voltage window requirements.

In some embodiments described herein, in a memory having a cross-point memory architecture, deselected cells may have, at consecutive times, a bias voltage applied which may increase the VT of the deselected cells. A memory cell that has been selected to be written to (e.g., target cell) may be subjected to, just before the selection, a bias voltage near the selected memory cell's VT, which may decrease the voltage required to threshold the memory cell (e.g., the resistance across the memory cell decreases rapidly). This may facilitate the selection of a reset memory cell (e.g., relatively high VT) in a memory array while inhibiting unintended selection of deselected set memory cells (e.g., relatively low VT).

Figure 1:
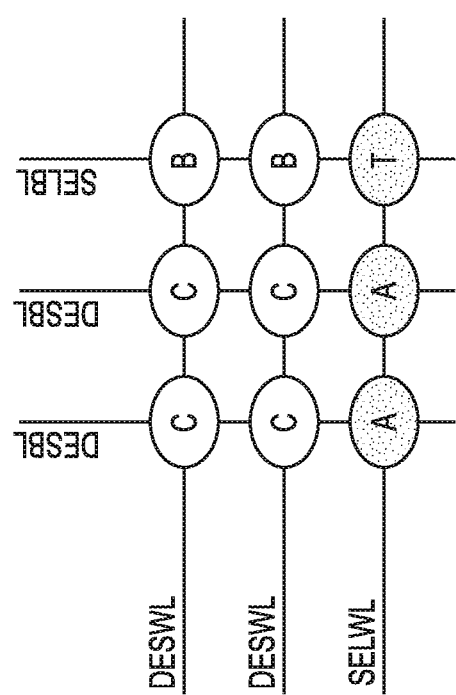
FIG. 1 is a schematic illustration of a portion of a memory array according to an embodiment of the disclosure.

FIG. 1 is a schematic illustration of a portion of a cross-point memory array 100 according to an embodiment of the disclosure. From a voltage window budget perspective, the operation that may require the largest voltage magnitude is the selection of a reset memory cell. As previously described, a reset memory cell has the chalcogenide of the storage element in an amorphous state (e.g., reset state). A memory cell in a reset state may have the highest threshold voltage (VT_RESET_max) of the memory cells of the memory array.

As shown in FIG. 1, the selected reset cell is labeled target cell T. The target cell T may be coupled to a first memory access line (SELBL) and a second memory access line (SELWL). The deselected cells are labeled A cells on memory access line SELWL and B cells on memory access line SELBL. The remaining cells on deselected memory access lines DESBL and DESWL are labeled C cells. In some embodiments, deselected memory access lines DESWL and DESBL may be coupled to a common voltage (e.g., 0V, ground) during a memory operation on target cell T.

To select the target cell T, voltages may be provided to the first memory access line SELBL coupled to the target cell T and the second memory access SELWL line coupled to the target cell T to apply a bias voltage across the target cell T. In some embodiments, voltages of equal magnitude and opposite polarity may be provided to the first memory access line and second memory access line side (e.g., V_SELWL=−V_SELBL). The maximum threshold voltage of the target cell T should be equal to or less than twice the voltage applied to the memory access lines (e.g., VT_RESET< 2V_SELWL or 2V_SELBL), otherwise, the target cell T may not be successfully selected. The provided voltages may be as high as the off-chip maximum voltage available in order to facilitate selecting the target cell T that may have a high reset VT. However, the voltages provided to the memory access lines should be low enough to prevent the undesired selection of deselected memory cells. That is, the voltage provided to the first memory access line SELWL should be less than the minimum threshold voltage of the A cells, and the voltage provided to memory access line SELBL should be less than the minimum threshold voltage of the B cells.

One or more of the deselected memory cells may have a low VT. For example, a memory cell where a chalcogenide storage element is in a crystalline state (e.g., a set memory cell). Memory cells with low VT may be prone to undesired selection during a write operation of the selected memory cell (e.g., target cell T). Undesired selection of a deselected memory cell (e.g., A cells and B cells) may lead to corruption of the data stored by the deselected memory cell and/or desired data not being written to the target cell T. To increase the voltage window, the VT of the deselected cells may be increased, and/or the VT of the target cell may be decreased.

In some embodiments, a pre-bias voltage may be applied to a memory cell. A pre-bias voltage may be a bias voltage applied to a memory cell prior to a memory operation (e.g., write, read). In some embodiments, the pre-bias voltage may be applied in response to receiving a request for a memory operation. In some embodiments, the memory operation may apply a separate bias voltage across the memory cell to execute the desired operation after the pre-bias voltage has been applied. In some embodiments, one or more pre-bias voltages may be used in place of the separate bias voltage associated with the memory operation. In some embodiments, the bias voltage associated with the memory operation may have a different magnitude and/or duration than the pre-bias voltage. In some embodiments, the bias voltage associated with the memory operation may have the same magnitude and/or duration as the pre-bias voltage.

In some embodiments, a low pre-bias voltage (VL) may be applied across a memory cell that is lower than the VT of the memory cell. The low pre-bias voltage may be such that the ratio of VL/VT is equal to or below a threshold value. In some embodiments, the threshold value may be 0.8. The VT of the memory cell may increase responsive to applying the low pre-bias voltage over a period of time. In some embodiments, a high pre-bias voltage (VH) may be applied across a memory cell. The magnitude of the high pre-bias voltage may be greater than the magnitude of the low pre-bias voltage (VL<VH). The magnitude of the high pre-bias voltage may be lower than the VT of the memory cell. However, in contrast to applying the low pre-bias voltage, the VT of the memory cell may decrease responsive to applying the high pre-bias voltage for a period of time. The high pre-bias voltage may be such that the ratio of VH/VT is above a threshold value. In some embodiments, the threshold value may be 0.8. In summary, when a pre-bias voltage below VT is applied to a memory cell, the VT of the memory cell will increase if the pre-bias voltage applied is below a threshold value, and the VT of the memory cell will decrease if the pre-bias voltage applied is above the threshold value. In some embodiments, values of VH and VL may be chosen based, at least in part, on a typical (e.g., average) VT of a memory cell in a reset state in a memory array. In some embodiments, values of VH and VL may be chosen based, at least in part, on distributions of one or more cells in a set state and one or more cells in a reset state within an array.

In some embodiments, the change in VT responsive to the applied pre-bias voltage (VL or VH) may be transient. That is, after a period of time, the VT of the memory cell returns to its original state after the pre-bias voltage is removed. The logic state of the memory cell may not be altered or permanently altered by applying the pre-bias voltage.

Figure 2:
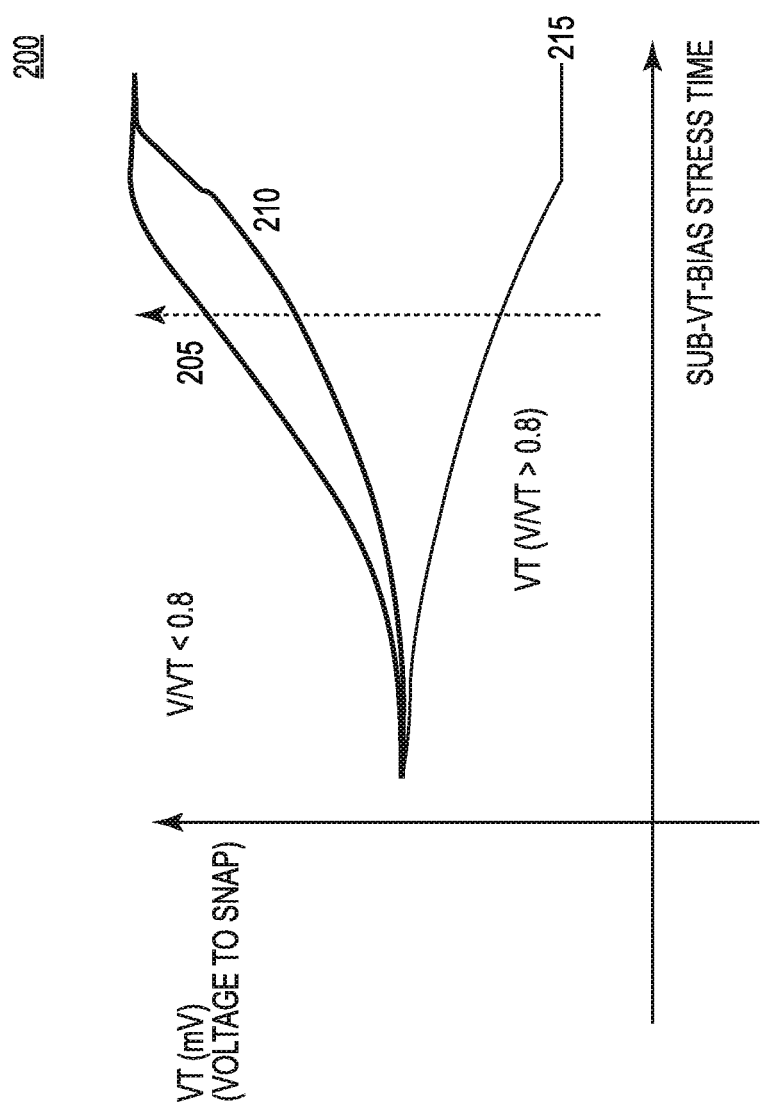
FIG. 2 is a plot of threshold voltage versus time of a memory cell according to an embodiment of the disclosure.

FIG. 2 is a plot 200 of threshold voltage (VT) of a memory cell over time when a pre-bias voltage (V) is applied across the memory cell according to an embodiment of the disclosure. Curves 205 and 210 illustrate the rise in VT of a memory cell when a pre-bias voltage V applied is a low pre-bias voltage. Curve 210 shows a rise in VT when the low pre-bias voltage is well below the initial VT of the memory cell (e.g., V=3.0V, VT=6.0V). Curve 205 shows a rise in VT when the low pre-bias voltage V is closer to the initial VT of the memory cell (e.g., V=4.0V, VT=6.0V). As shown in FIG. 2, curve 210 has a lower slope than curve 205. That is, the VT of the memory cell is increasing faster over time for curve 205 than curve 210. As the pre-bias voltage V increases, the slope of the VT vs. time curve may increase.

However, once the ratio V/VT reaches a threshold value, the slope of the VT vs. time curve may no longer increase and may become negative. This negative slope is shown in curve 215. Curve 215 shows a decrease in VT of a memory cell when the pre-bias voltage V applied is a high pre-bias voltage (e.g., V=5.5V, VT=6.0V). The bias voltage V may be close in magnitude to the initial VT such that V/VT is over a threshold value (e.g., V/VT=0.8, V/VT=0.85, V/VT=0.9).

Without being bound to a particular theory, the increase in VT of a memory cell in response to the application of a low pre-bias voltage may be due to the acceleration of the trapping in a chalcogenide material which may drive the VT increase. Without being bound to a particular theory, the decrease in VT of a memory cell in response to a high pre-bias voltage may be driven by the current noise around the threshold voltage VT which may then trigger a threshold event (e.g., snap) at a lower voltage magnitude.

The variations in the rate of change of the VT of a memory cell based on the magnitude of the pre-bias voltage, as shown by the slopes of the VT vs. time curves 205, 210, and 215, may be used to facilitate expanding the voltage window of a memory array. In some embodiments, the VT increase of a memory cell through application of a low pre-bias may be exploited to increase the VT for set memory cells having very low VT, which may provide the advantage of reducing the likelihood of unintended selection of set memory cells, while the VT decrease of a memory cell through application of a high pre-bias may be exploited to lower the VT for reset memory cells having very high VT, which may facilitate selection of reset memory cells.

By memory cells having very low or very high VT, it is meant to refer to memory cells that have threshold voltage values that may fall outside an expected range of VT for a memory array due to cell-to-cell variability. These memory cells may not be able to be properly selected for writing to by conventional selection methods. With conventional methods these very low and/or very high VT memory cells may cause data corruption, writing errors, and/or read errors of the memory cells and/or other memory cells in the memory array that may not be very high or very low VT cells. Widening the voltage window using pre-bias as described in the embodiments disclosed herein may facilitate operation of memory arrays that include very high and/or very low VT cells.

Figure 3:
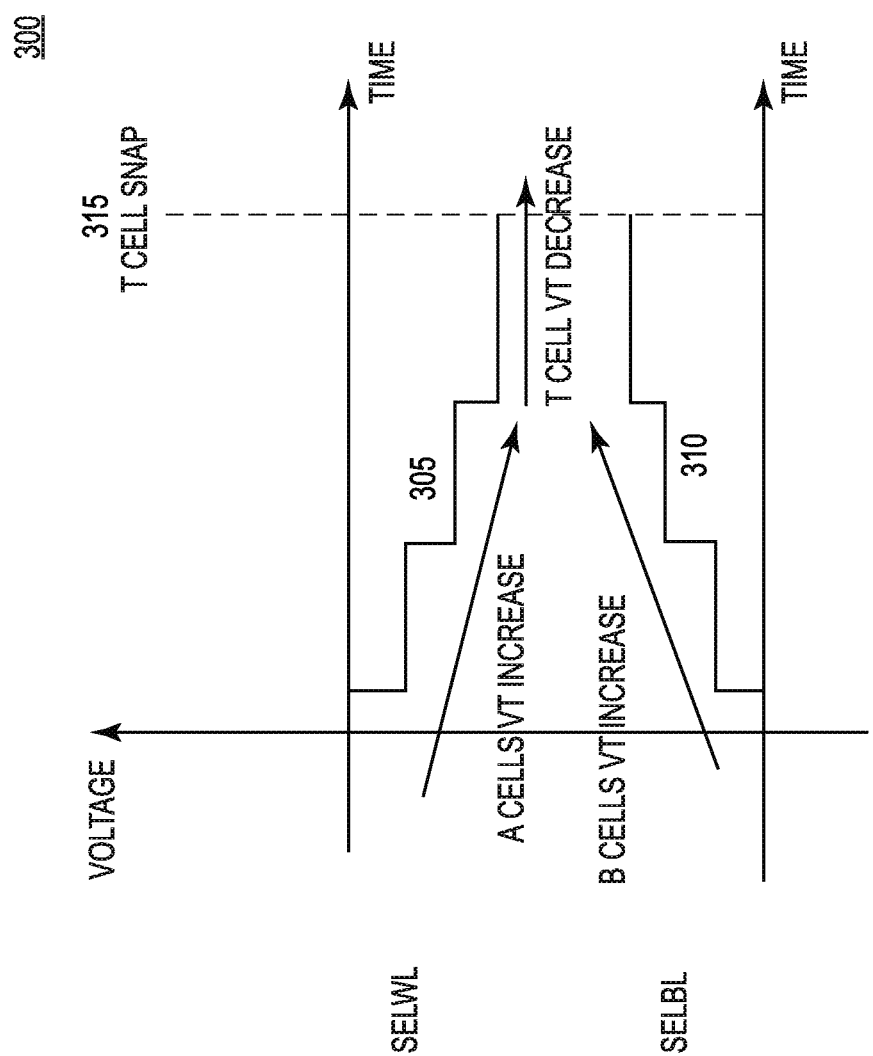
FIG. 3 is a plot of voltages provided to memory access lines versus time according to an embodiment of the disclosure.

FIG. 3 is a plot 300 of pre-bias voltages applied across memory cells over time according to an exemplary implementation of the disclosure. In the exemplary implementation shown in FIG. 3, all deselected memory access lines (e.g., DESBL and DESWL in FIG. 1) may be coupled to a common voltage (e.g., ground). The operation of the exemplary implementation may be a write operation. The memory access lines coupled to a target cell (e.g., SELWL and SELBL in FIG. 1) may be provided varying voltages over time. Curve 305 shows the voltages applied to a first memory access line (SELWL) and curve 310 shows the voltages applied to a second memory access line (SELBL). As shown in FIG. 3, the first and second memory access lines are stepped through a plurality of voltages, where the magnitudes of the voltages are increased with each subsequent step. For example, the voltage applied to SELWL becomes more negative and the voltage applied to SELBL becomes more positive. Each voltage is held constant for a period of time prior to stepping to the next voltage. As the magnitude of the voltage of SELWL is increased, the VT of the memory cells coupled to SELWL may increase (e.g., A cells shown in FIG. 1). As the magnitude of the voltage of SELBL is increased, the VT of the memory cells coupled to SELBL may increase (e.g., B cells shown in FIG. 1). The magnitude of the pre-bias voltage V across a target cell coupled to SELWL and SELBL (e.g., target cell T shown in FIG. 1) may be such that the ratio of V/VT of the target cell is above a threshold value. The VT of the target memory cell may decrease responsive to the pre-bias voltage. In some embodiments, the pre-bias voltage across the target cell may be held at this magnitude until the VT of the target cell decreases to where a threshold event 315 occurs at the target cell. That is, the VT of the target cell decreases until it reaches the magnitude of the pre-bias voltage applied across the target cell, and the resistance across the target cell decreases, facilitating current flow through the target cell. As mentioned previously, this may be referred to as a snap event. In some embodiments, after the final pre-bias voltage has been held for a period of time, a subsequent bias voltage associated with the memory operation (e.g., write) may be applied across the target cell to threshold the target cell. In some embodiments, the target cell may have a low VT (e.g., set state). When the target cell has a low VT, it may snap at a lower pre-bias voltage step than a target cell having a high VT. Once the target cell has snapped, the magnitude of the voltage of the memory access lines may cease to be increased. In other words, in some embodiments, fewer pre-bias voltage steps may be applied to a target cell, based, at least in part, on the VT of the target cell.

In one illustrative example, SELWL and SELBL may both initially be provided 0V. Subsequently, SELWL may be biased to −1.5V and SELBL may be biased to 1.5V. After a period of time, SELWL may be biased to −3.0V and SELBL may be biased to 3.0V. The SELWL may then be biased to −5.0V and SELBL may then be biased to 5.0V. As shown in FIG. 3, SELWL and SELBL may be held at these voltage levels until a snap event occurs at the memory cell coupled between SELWL and SELBL. Other voltage magnitudes may be used for the voltages in some embodiments. The voltages provided to the memory access lines to provide pre-bias voltage levels applied across the memory cell may be selected based, at least in part, on a threshold value of a ratio V/VT (e.g., 0.8).

In some embodiments, more or fewer pre-bias voltage steps may be applied across a memory cell. As discussed previously, more or fewer pre-bias voltage steps may be applied in addition to or in lieu of a bias voltage associated with a memory operation. In some embodiments, the SELWL and SELBL are not provided voltages equal in magnitude. For example, SELWL may be biased to −1.0V and SELBL may be biased to −1.5V. In some embodiments, SELWL and SELBL are stepped sequentially, where SELWL is stepped to the next voltage prior to SELBL being stepped to the next voltage, or vice versa. Although shown as square steps in FIG. 3, in some embodiments, the pre-bias voltages may be gradually ramped between each pre-bias voltage to be held for a period of time. In some embodiments, the voltage differences between adjacent steps may be equal. In some embodiments, there may be a defined number of pre-biased voltages applied. In some embodiments, the pre-bias voltages may be stepped until a threshold event occurs at a target cell. Other protocols for increasing the pre-bias voltage across the target cell may also be used.

In another embodiment similar to the one shown in FIG. 3, SELWL may initially be provided +4V and SELBL may be provided −4V. Deselected cells coupled to only one or the other of the two memory access lines SELWL, SELBL may have a magnitude of 4V across the cells. One or more deselected cells may be in a set state. The one or more deselected cells in the set state may have a distribution of threshold voltages VT centered at 5V. One or more deselected cells may be in a reset state. The one or more deselected cells in the reset state may have a distribution of threshold voltages VT centered at 9V. Both reset and set state deselected cells are biased at a low pre-bias voltage, and the VT of both reset and set state deselected cells may increase.

A targeted cell coupled to both memory access lines SELWL, SELBL may be have a voltage magnitude of 8V across the cell. If the target cell is in a reset state, the target cell may have a VT at or near 9V. The voltage applied across the target cell by the memory access lines may be a high pre-bias voltage and may cause the VT of the target cell to decrease. Alternatively, if the target cell is in a set state, the target cell may have a VT at or near 5V, and the target cell may experience a threshold event.

If the target cell is in the reset state and has a VT over 8V even after the VT has decreased responsive to the high pre-bias voltage, the SELWL may subsequently be provided a voltage of +5V and the SELBL provided a voltage of −5V. The deselected cells in either set or reset states may continue to have low pre-bias voltages applied across the cells. The distribution of threshold voltages for deselected cells in both states may continue to increase. The target cell may have a voltage magnitude of 10V applied across the cell. The applied voltage may be above the VT of the target cell and cause the target cell to threshold.

As described in this exemplary embodiment, the initial biasing of the memory access lines may reduce the threshold voltage of a reset cell at a high end of the distribution of threshold voltages (e.g., above 10V) to be selected by applying 10V across the target cell by initially pre-biasing the target cell to reduce the threshold voltage of the target cell to below 10V. The particular voltages have been provided by way of example, and other voltages, voltage distributions, and/or number of pre-bias voltages may be used in other embodiments.

Figure 4:
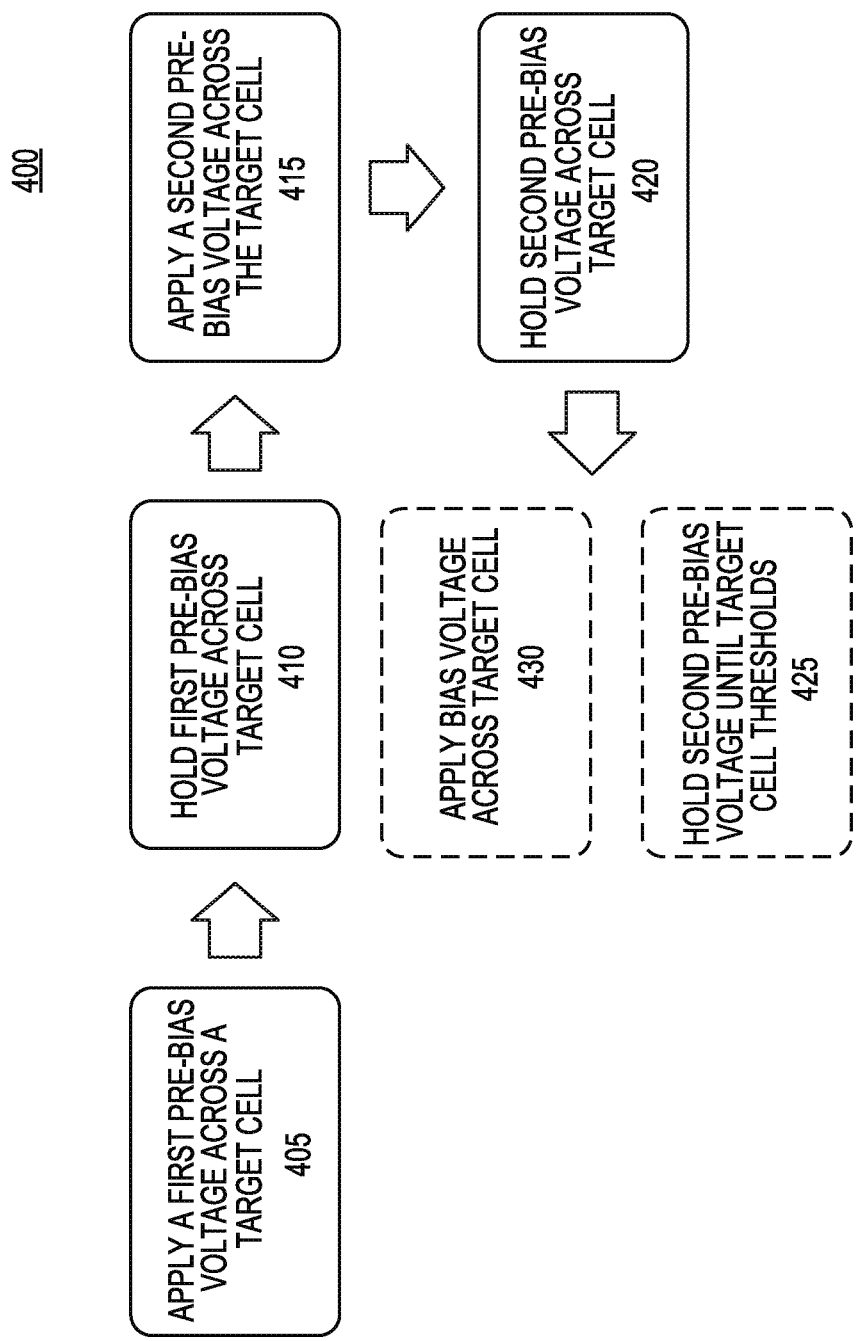
FIG. 4 is a flow chart of a method according to an embodiment of the disclosure.

FIG. 4 is a flow chart of a method 400 according to an embodiment of the disclosure. In some embodiments, method 400 may be used to select a target cell of a memory array coupled to two memory access lines. The method 400 may reduce the VT of the target cell and/or increase the VT of deselected memory cells in the memory array that are coupled to one or the other of the two memory access lines. The method 400 may increase the voltage window of the memory array in some embodiments. In Step 405, a first pre-bias voltage may be applied across a target cell. The first pre-bias voltage may be applied across the memory cell by providing voltages to memory access lines as described in reference to FIG. 3. The first pre-bias voltage may be held constant across the target cell at Step 410 for a period of time. As described above, during this time, deselected memory cells coupled to one of the memory access lines may have an increase in VT in response to the first pre-bias voltage. At Step 415, a second pre-bias voltage may be applied across the target cell. The second pre-bias voltage may be greater in magnitude than the first pre-bias voltage. In some embodiments, the first pre-bias voltage is a low pre-bias voltage (VL) and the second pre-bias voltage is a high pre-bias voltage (VH). The magnitude of the first pre-bias voltage may be such that the ratio VL/VT is less than a threshold value of the target cell. The magnitude of the second pre-bias voltage may be such that the ratio VH/VT is above a threshold value of the target cell. As will be described in more detail below, pre-bias voltages may be applied across deselected cells coupled to one of the two memory access lines when the first and second pre-bias voltages are applied across the target cell. The pre-bias voltages applied across the deselected cells may be low pre-bias voltages (VL) having magnitudes such that the ratio VL/VT is less than a threshold value of the deselected cells.

The second pre-bias voltage may be held constant across the target cell at Step 420 for a period of time. The target cell may experience a decrease in VT responsive to the second pre-bias voltage. As mentioned previously, the second pre-bias voltage may have a magnitude such that the ratio of the pre-bias voltage to the VT of the target cell is greater than a threshold value (e.g., 0.8). In contrast, deselected memory cells coupled to one of the memory access lines further coupled to the target cell may further increase VT in response to the second pre-bias voltage as the deselected memory cells may be biased by one half of the second pre-biased voltage (e.g., VH/2). One half of the second pre-biased voltage may be such that the ratio over VT is less than the threshold value (e.g., (VH/2)/VT<0.8) of deselected memory cells. In some embodiments, the second pre-bias voltage may continue to be held across the target cell until the target cell thresholds (e.g., snaps back) at Step 425, at which time the target cell becomes conductive and allows current to flow. Alternatively, a separate bias voltage associated with a memory operation may be applied to the target cell at Step 430. The bias voltage applied at Step 430 may induce a threshold event in the target cell and/or other effect desired for the memory operation. Although two pre-bias voltages are applied in method 400, more than two pre-biasing voltages may be applied across the target cell (e.g., a third pre-bias voltage, a fourth pre-bias voltage, and so on).

The pre-bias voltages may be applied across the memory cell by memory access lines responsive to one or more control signals. The memory access lines may be coupled to memory access circuits (e.g., column and row decoder circuits) which may be further coupled to control logic, which may be configured to provide internal control signals to memory circuits (e.g., memory access circuits) to implement the method 400. The control logic may be implemented as hardware, software, or combinations thereof. For example, in some embodiments, the control logic may be an integrated circuit including circuits such as logic circuits and computational circuits. The circuits of the control logic may operate to execute various operations and provide control signals to other circuits of a memory array, such as memory array 100. In some embodiments, the control logic may be implemented as multiple control logic circuits. Other control logic circuits and/or other apparatuses may be used for implementing method 400.

Figure 5:
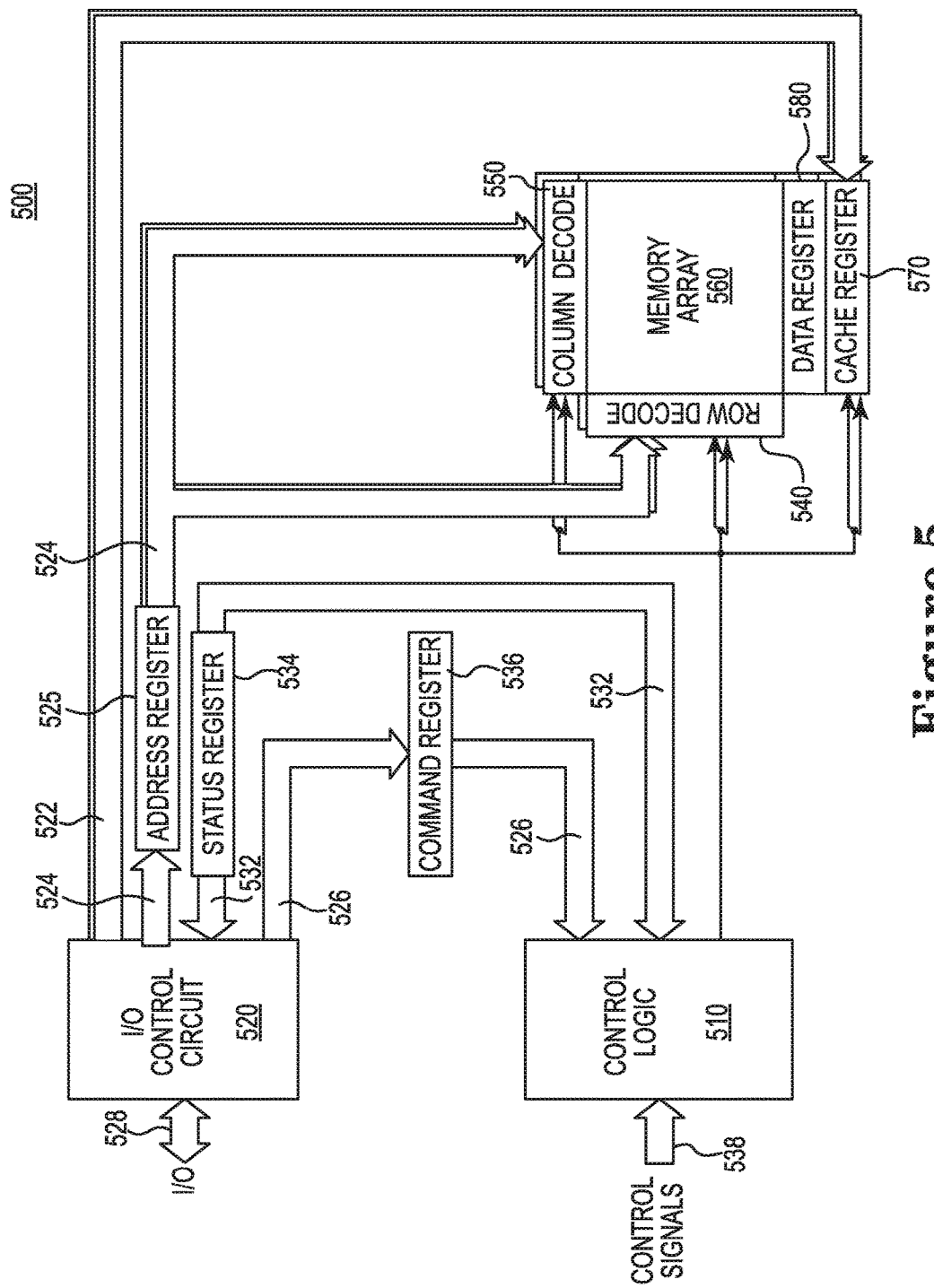
FIG. 5 is a functional diagram of a memory according to an embodiment of the disclosure.

FIG. 5 illustrates an apparatus that includes a memory device 500 according to an embodiment of the disclosure. The memory device 500 includes a memory array 560 with a plurality of memory cells that are configured to store data. The memory cells may be accessed in the array through the use of various signal lines, word lines (WLs) and/or bit lines (BLs). The memory cells may be non-volatile memory cells, such as NAND or NOR flash cells, phase change memory cells, or may generally be any type of memory cells. The memory cells of the memory array 560 can be arranged in a memory array architecture. For example, in one embodiment, the memory cells are arranged in a 3D cross-point architecture. In other embodiments, other memory array architectures may be used, for example, a single-level cross-point architecture, among others. The memory cells may be single level cells configured to store data for one bit of data. The memory cells may also be multi-level cells configured to store data for more than one bit of data.

A data strobe signal DQS may be transmitted through a data strobe bus (not shown). The DQS signal may be used to provide timing information for the transfer of data to the memory device 500 or from the memory device 504. The I/O bus 528 is connected to an I/O control circuit 520 that routes data signals, address information signals, and other signals between the I/O bus 528 and an internal data bus 522, an internal address bus 524, and/or an internal command bus 526. An address register 525 may be provided address information by the I/O control circuit 520 to be temporarily stored. The I/O control circuit 520 is coupled to a status register 534 through a status register bus 532. Status bits stored by the status register 534 may be provided by the I/O control circuit 520 responsive to a read status command provided to the memory device 500. The status bits may have respective values to indicate a status condition of various aspects of the memory and its operation.

The memory device 500 also includes a control logic 510 that receives a number of control signals 538 either externally or through the command bus 526 to control the operation of the memory device 500. The control signals 538 may be implemented with any appropriate interface protocol. For example, the control signals 538 may be pin based, as is common in dynamic random access memory and flash memory (e.g., NAND flash), or op-code based. Example control signals 538 include clock signals, read/write signals, clock enable signals, etc. A command register 536 is coupled to the internal command bus 526 to store information received by the I/O control circuit 520 and provide the information to the control logic 510. The control logic 510 may further access a status register 534 through the status register bus 532, for example, to update the status bits as status conditions change. The control logic 510 may be configured to provide internal control signals to various circuits of the memory device 500. For example, responsive to receiving a memory access command (e.g., read, write), the control logic 510 may provide internal control signals to control various memory access circuits to perform a memory access operation. The various memory access circuits are used during the memory access operation, and may generally include circuits such as row and column decoders, charge pump circuits, signal line drivers, data and cache registers, I/O circuits, as well as others.

The address register 525 provides block-row address signals to a row decoder 540 and column address signals to a column decoder 550. The row decoder 540 and column decoder 550 may be used to select blocks of memory cells for memory operations, for example, read and write operations. The row decoder 540 and/or the column decoder 550 may include one or more signal line drivers configured to provide a biasing signal to one or more of the signal lines in the memory array 560. In some embodiments, the signal line drivers of the row decoder 540 and/or the column decoder 550 may provide one or more pre-biasing signals to one or more signal lines in the memory array 560 to apply one or more pre-bias voltages across a memory cell of the memory array 560. The pre-bias voltages may be applied responsive to one or more control signals provided by the control logic 510. The control logic 510 may be used to implement the control logic as previously described in reference to FIG. 4.

For a write operation, after the row address signals have been applied to the address bus 524, the I/O control circuit 520 routes write data signals to a cache register 570. The write data signals are stored in the cache register 570 in successive sets each having a size corresponding to the width of the I/O bus 528. The cache register 570 sequentially stores the sets of write data signals for an entire row or page of memory cells in the array 560. All of the stored write data signals are then used to write a row or page of memory cells in the array 560 selected by the block-row address coupled through the address bus 524. In a similar manner, during a read operation, data signals from a row or block of memory cells selected by the block-row address coupled through the address bus 524 are stored in a data register 580. The data register 580 and the cache register 570 may act as a single register for some page operations. For example, data stored in the data register 580 may be also stored in the cache register 570. Sets of data signals corresponding in size to the width of the I/O bus 528 are then sequentially transferred through the I/O control circuit 520 from the data register 580 and/or the cache register 570 to the I/O bus 528.

Figure 6:
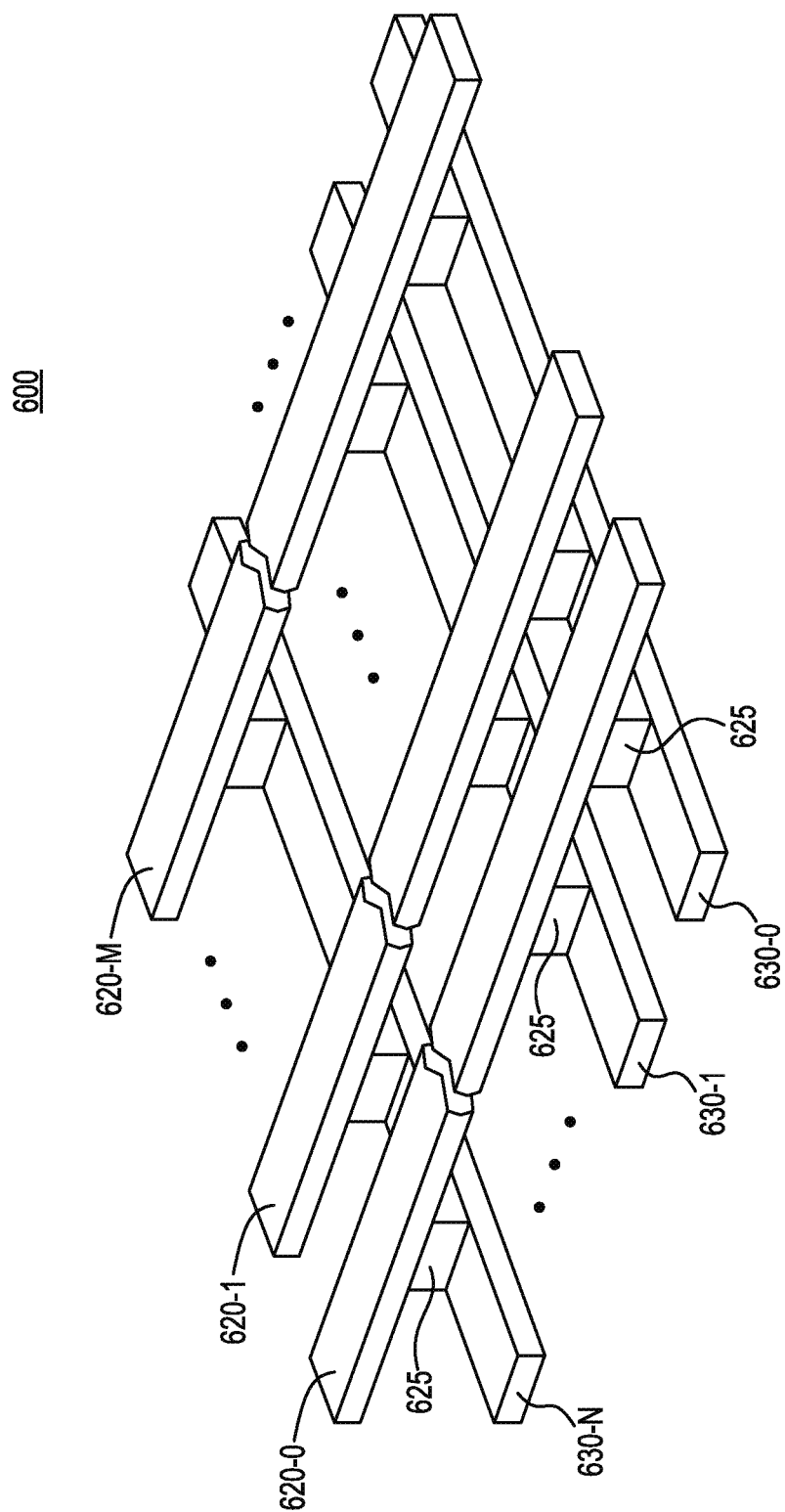
FIG. 6 is a schematic illustration of a portion of a memory array according to an embodiment of the disclosure.

FIG. 6 is a diagram illustrating a portion of an array 600 of memory cells according to an embodiment of the disclosure. The array 600 may be used to implement the memory array 560 of FIG. 5 in some embodiments. In the example illustrated in FIG. 6, the array 600 is a cross-point array including a first number of conductive lines 630-0, 630-1, . . . , 630-N, e.g., access lines, which may be referred to herein as word lines, and a second number of conductive lines 620-0, 620-1, . . . , 620-M, e.g., access lines, which may be referred to herein as bit lines. A memory cell 625 is located at each of the intersections of the word lines 630-0, 630-1, . . . , 630-N and bit lines 620-0, 620-1, . . . , 620-M and the memory cells 625 can function in a two-terminal architecture, e.g., with a particular word line 630-0, 630-1, . . . , 630-N and bit line 620-0, 620-1, . . . , 620-M serving as the electrodes for the memory cells 625.

The memory cells 625 can be resistance variable memory cells, e.g., RRAM cells, CBRAM cells, PCRAM cells, and/or STT-RAM cells, among other types of memory cells. Memory cells can include, for example, a storage element, e.g., memory material, and a select element, e.g., a select device, an access device. The select element can be a diode or a non-ohmic device (NOD), among others. The select element can include, in some examples, select material, a first electrode material, and a second electrode material. The storage element of memory cell 625 can include a memory portion of the memory cell 625, e.g., the portion programmable to different data states. For instance, in resistance variable memory cells, a storage element can include the portion of the memory cell having a resistance that is programmable to particular levels corresponding to particular data states responsive to applied programming voltage and/or current pulses, for instance. Embodiments are not limited to a particular resistance variable material or materials associated with the storage elements of the memory cells 625. The memory cell 625 can include a material programmable to different data states (e.g., chalcogenide). For instance, the memory cell 625 may be written to store particular levels corresponding to particular data states responsive to applied writing voltage and/or current pulses, for instance. Embodiments are not limited to a particular material or materials. For instance, the material can be a chalcogenide formed of various doped or undoped materials. Other examples of materials that can be used to form storage elements include binary metal oxide materials, colossal magnetoresistive materials, and/or various polymer based resistance variable materials, among others.

In operation, the memory cells 625 of array 600 can be written to by applying a voltage, e.g., a write voltage, across the memory cells 625 via selected word lines 630-0, 630-1, . . . , 630-N and bit lines 620-0, 620-1, . . . , 620-M. A sensing, e.g., read, operation can be used to determine the data state of a memory cell 625 by sensing current, for example, on a bit line 620-0, 620-1, . . . , 620-M corresponding to the respective memory cell responsive to a particular voltage applied to the selected word line 630-0, 630-1, . . . , 630-N to which the respective cell is coupled.

Figure 7:
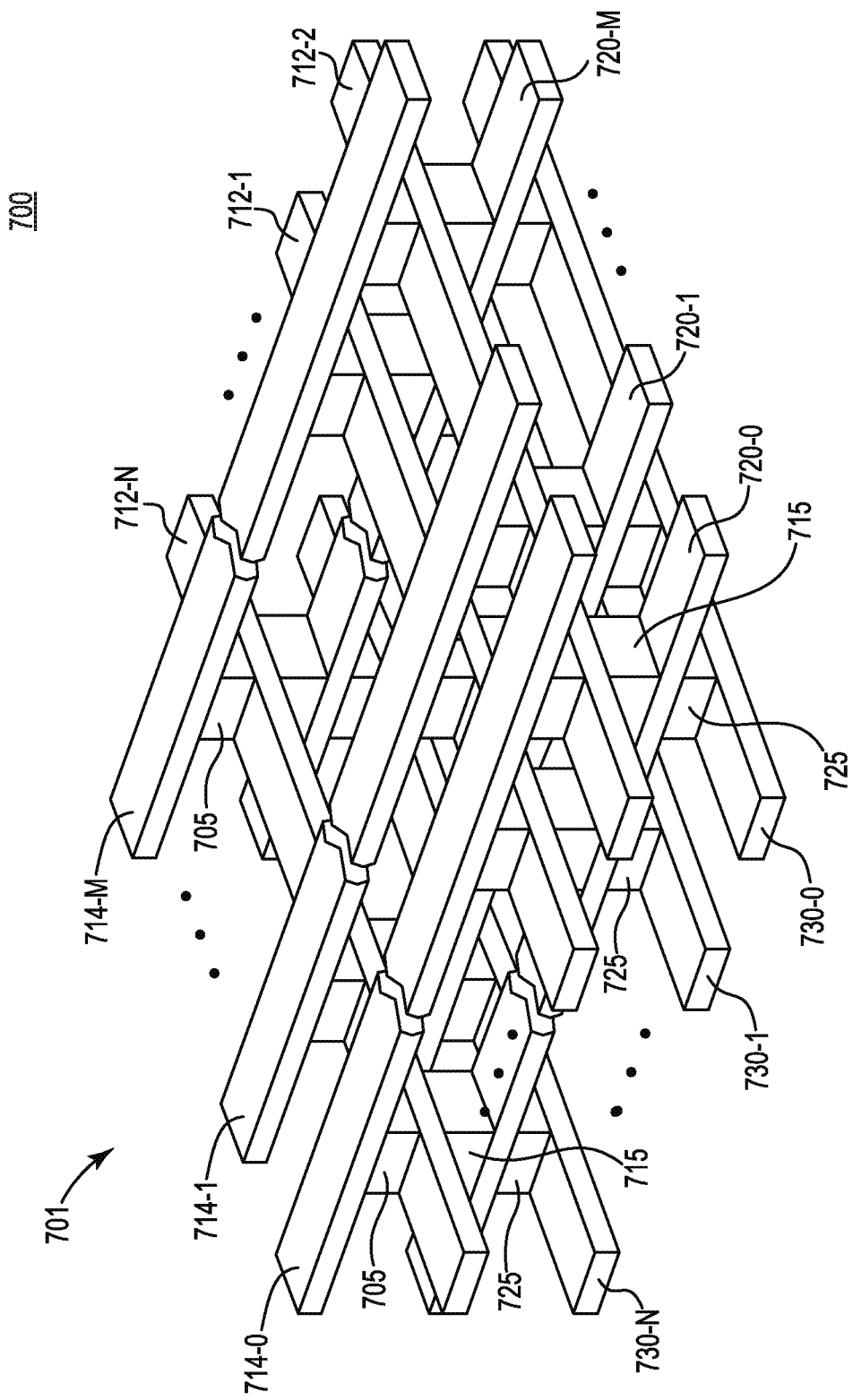
FIG. 7 is a schematic illustration of a portion of a memory array according to an embodiment of the disclosure.

FIG. 7 is a diagram illustrating a portion of an array 700 of memory cells. The array 700 may be used to implement the memory array 560 of FIG. 5 in some embodiments. In the example illustrated in FIG. 7, the array 700 is configured in a cross-point memory array architecture, e.g., a three-dimensional (3D) cross-point memory array architecture. The multi-deck cross-point memory array 700 comprises a number of successive memory cells, e.g., 705, 715, 725 disposed between alternating, e.g., interleaved, decks of word lines, e.g., 730-0, 730-1, . . . , 730-N and 712-0, 712-1, . . . , 712-N extending in a first direction and bit lines, e.g., 720-0, 720-1, . . . , 720-M and 714-0, 1314-1, . . . , 714-M extending in a second direction. The number of decks can be expanded in number or can be reduced in number, for example. Each of the memory cells 705, 715, 725 can be configured between word lines, e.g., 730-0, 730-1, . . . , 730-N and 712-0, 712-1, . . . , 712-N and bit lines, e.g., 720-0, 720-1, . . . , 720-M and 714-0, 714-1, . . . , 714-M, such that a single memory cell 705, 715, 725 is directly electrically coupled with and is electrically in series with its respective bit line and word line. For example, array 700 can include a three-dimensional matrix of individually-addressable, e.g., randomly accessible, memory cells that can be accessed for data operations, e.g., sense and write, at a granularity as small as a single storage element or multiple storage elements. In a number of embodiments, memory array 700 can include more or less bit lines, word lines, and/or memory cells than shown in the examples in FIG. 7.

Memories in accordance with embodiments of the present invention may be used in any of a variety of electronic devices including, but not limited to, computing systems, electronic storage systems, cameras, phones, wireless devices, displays, chip sets, set top boxes, or gaming systems.

From the foregoing it will be appreciated that, although specific embodiments of the invention have been described herein for purposes of illustration, various modifications may be made without deviating from the spirit and scope of the invention. Accordingly, the invention is not limited except as by the appended claims.

What is claimed is:

1. An apparatus comprising:
a first memory access line;
a second memory access line;
a memory cell coupled to the first memory access line and to the second memory access line, wherein the memory cell is configured to have a threshold voltage;
memory access circuits coupled to the first and second memory access lines and configured to provide a respective voltage to the first and second memory access lines; and
a control logic circuit coupled to the memory access circuits and configured to provide control signals to memory access circuits to apply a first pre-bias voltage across the memory cell by the first and second memory access lines and to further apply thereafter a second pre-bias voltage across the memory cell by the first and second memory access lines,
wherein the second pre-bias voltage has a greater magnitude than the first pre-bias voltage, the first and second pre-bias voltages are below the threshold voltage, and wherein a ratio of the second pre-bias voltage and the threshold voltage are above a threshold value.

2. The apparatus of claim 1, wherein the threshold voltage of the memory cell decreases responsive to the second pre-bias voltage.

3. The apparatus of claim 1, wherein the memory cell includes a selector device and a storage element.

4. The apparatus of claim 3, wherein the storage element has a first threshold voltage corresponding to a first logic state or a second threshold voltage corresponding to a second logic state.

5. The apparatus of claim 4, wherein the storage element includes a chalcogenide material.

6. The apparatus of claim 1, wherein the first and second memory access lines are configured to receive voltages of equal magnitude.

7. The apparatus of claim 1, further comprising a memory array, the memory array comprising:
a plurality of memory access lines; and
a plurality of memory cells coupled to respective ones of the plurality of memory access lines,
wherein the first and second memory access lines are each one of the plurality of memory access lines and the memory cell is one of the plurality of memory cells.

8. The apparatus of claim 7, wherein the memory array is a three-dimensional array.

9. The apparatus of claim 7, wherein the plurality of memory access lines and the plurality of memory cells are arranged in a cross-point architecture.

10. The apparatus of claim 1, wherein the second pre-bias voltage is configured to threshold the memory cell.

11. The apparatus of claim 1, wherein the control logic is further configured to provide control signals to memory access circuits to apply a bias voltage across the memory cell by the first and second memory access lines.

12. The apparatus of claim 1, further comprising a deselected memory cell coupled to the first or second memory access line, wherein a third pre-bias voltage is applied across the deselected cell responsive to the first or the second pre-bias voltage being applied across the memory cell,
wherein a ratio of the third pre-bias voltage and a threshold voltage of the deselected memory cell are below a threshold value.

13. A method comprising:
applying a first pre-bias voltage across a memory cell;
holding the first pre-bias voltage across the memory cell for a first period of time;
applying a second pre-bias voltage across the memory cell; and
holding the second pre-bias voltage across the memory cell for a second period of time;
wherein the second pre-bias voltage has a magnitude such that a ratio of the second pre-bias voltage and a threshold voltage of the memory cell is above a threshold value.

14. The method of claim 13, further comprising holding the second pre-bias voltage across the memory cell until the memory cell thresholds.

15. The method of claim 13, further comprising applying a bias voltage across the memory cell.

16. The method of claim 13, wherein the magnitude of the first pre-bias voltage is less than the magnitude of the second pre-bias voltage.

17. The method of claim 13, wherein the first period of time is less than the second period of time.

18. A method, comprising:
applying a first voltage to a first access line, wherein threshold voltages of a first plurality of memory cells coupled to the first access line are increased;
applying a second voltage to a second access line, wherein threshold voltages of a second plurality of memory cells coupled to the second access line are increased; and
applying a sum of the first and second voltages across a target memory cell coupled to both the first and second access lines, wherein the threshold voltage of the target memory cell are decreased.

19. The method of claim 18, further comprising:
increasing the magnitude of the first and second voltages over time.

20. The method of claim 19 wherein increasing the magnitude of the first and second voltages over time comprises stepping the first and second voltages through a plurality of increasing voltage magnitudes.

21. The method of claim 18, wherein applying the first voltage to the first access line comprises applying a voltage, wherein a ratio of the voltage with the threshold voltages of the first plurality of memory cells is equal to or less than 0.8.

22. The method of claim 18 wherein applying the sum of the first and second voltages across a target memory cell comprises applying a sum voltage, wherein a ratio of the sum voltage with the threshold voltage of the target memory cell that is greater than 0.8.

* * * * *